(12) United States Patent
Miranda et al.

(10) Patent No.: US 7,521,284 B2
(45) Date of Patent: Apr. 21, 2009

(54) SYSTEM AND METHOD FOR INCREASED STAND-OFF HEIGHT IN STUD BUMPING PROCESS

(75) Inventors: Ariel Lizaba Miranda, Albay (PH); Raymundo Monasterio Camenforte, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 11/713,900

(22) Filed: Mar. 5, 2007

(65) Prior Publication Data
US 2008/0217768 A1 Sep. 11, 2008

(51) Int. Cl.
*H01L 21/44* (2006.01)
*H01L 21/48* (2006.01)
*H01L 21/50* (2006.01)

(52) U.S. Cl. .............. 438/106; 438/108; 257/E21.499; 257/E21.503; 257/E21.509

(58) Field of Classification Search .............. 438/51, 438/55, 64, 106, 107, 108
See application file for complete search history.

(56) References Cited

U.S. PATENT DOCUMENTS

| 5,558,270 | A  | * | 9/1996 | Nachon et al. ........... 228/180.5 |
| 5,559,054 | A  | * | 9/1996 | Adamjee .................... 438/617 |
| 5,871,141 | A  | * | 2/1999 | Hadar et al. ............. 228/180.5 |
| 6,926,796 | B1 | * | 8/2005 | Nishida et al. .............. 156/312 |
| 7,229,906 | B2 | * | 6/2007 | Babinetz et al. ............. 438/617 |

* cited by examiner

*Primary Examiner*—David Nhu
(74) *Attorney, Agent, or Firm*—Yingsheng Tung; Wade J. Brady, III; Frederick J. Telecky, Jr.

(57) ABSTRACT

System and method for creating single stud bumps having an increased stand-off height. A preferred embodiment includes a method of using a capillary for creating stud bumps in a flip chip assembly, the capillary includes a hole section adapted to pass a wire, a chamfer section providing a transition from the hole section to a stud bump section, and a sidewall within the stud bump section, the sidewall having a sidewall height, wherein the side wall height is equal to, or greater than, the a diameter of the stud bump section.

5 Claims, 4 Drawing Sheets

SYSTEM AND METHOD FOR INCREASED STAND-OFF HEIGHT IN STUD BUMPING PROCESS

TECHNICAL FIELD

The present invention relates generally to a system and method for manufacturing stud bumps in a flip chip assembly and, more particularly, to a system and method for manufacturing stud bumps with a higher stand-off height that results in stronger, more reliable joints.

BACKGROUND

In flip chip microelectronic assembly, electronic components or "chips" are connected face-down (i.e. "flipped") onto substrates, circuit boards, or carriers by means of conductive bumps that are formed on the chip's bond pads. Flip chip assembly eliminates bond wires, greatly reduces induction and capacitance in connections, and shortens electrical paths, thereby providing a device with high speed electrical performance. When wire bond connections are used, they are limited to the perimeter of the die, which increases the die size as the number of connections increases. Flip chip connections use the whole area of the die, not just the perimeter, and can accommodate many more connections on a smaller die.

Flip chip assemblies are manufactured in three stages: bumping the die or wafer (i.e. creating stud bumps on the bond pads of the die), attaching the bumped die to the substrate, and filling the space under the die with an electrically non-conductive underfill material. The bump provides an electrically conductive path from the chip to the substrate. The bump also provides a thermally conductive path to carry heat from the chip to the substrate. Additionally, the bump provides a spacer, preventing electrical contact between the chip and substrate.

In a typical process, gold is used to form the stud bumps. In a gold bump flip chip, the bumps are formed on the die using a modified wire bonding technique. A gold wire passes through a capillary tool and is melted to form a ball or sphere on a chip bond pad. In wire bonding, connections are made by keeping the wire bonded to the sphere. In a flip chip assembly, after the gold ball is attached to the chip bond pad, then the gold wire is broken off leaving a stud bump. The wire may be separated, for example, using a wire clamp to grab the gold wire while the wire and capillary are moved away from the ball, which causes the wire to break. When the gold wire is broken, a stud bump remains on the bond pad and provides a permanent connection to the underlying metal.

Once the stud bumps have been formed on the bond pads of a chip, the chip is then flipped so that the stud bumps face downward and are aligned with other bond pads on a substrate. Once aligned, each stud bump is electrically and mechanically connected to a corresponding substrate bond pad using solder. Gold stud bump flip chips may also be attached to the substrate bond pads with a electrically conductive adhesive or by thermosonic gold-to-gold connection. The surface of the chip may be covered with a protective polymer overcoat such as polyimide (PIQ) or poly-benzoxasole (PBO). The surface of the substrate may be covered with a solder resist.

Typically, the protective overcoat is approximately 5 um thick, and solder resist is approximately 30 um thick. The stand-off height for typical prior art stud bumps is approximately 36 um, and bond pads are typically 15 um thick. The resulting gap between bond pads on the chip and bond pads on the substrate is approximately 35 um, and the gap between the protective overcoat on the chip and solder resist on the substrate is approximately 15 um. The underfill adhesive must flow in these gaps to fill all the space between the chip and the substrate.

In the final stage of assembly, the space between the chip and the substrate is filled with a non-conductive underfill adhesive that joins the entire surface of the chip to the substrate. The underfill protects the bumps from environmental factors such as moisture and provides mechanical strength to the assembly by making it a solid block. It also compensates for any thermal expansion difference between the chip and the substrate. The underfill mechanically locks the chip and the substrate together so that differences in thermal expansion do not break or damage the electrical connection of the bumps. The underfill may be dispensed along the edges of the assembly and then drawn into the area under the chip by capillary action.

The size of the effective joint that is formed between the chip and the substrate is determined in part by the size and shape of stud bump and the amount of solder that is applied. The underfill adhesive flows into the space between the chip and the substrate and around the stud bumps and solder. It is desirable that effective joint is as large as possible to optimize the electrical and mechanical connection between the chip and the substrate. Higher bonding force may be used to increase the solder joint area. The flip chip die bonder can press the die into the substrate with more force. A disadvantage of this method is a reduction in the clearance between the chip and the substrate, which makes it more difficult for the underfill to fill all the voids in the device. A further disadvantage is that using higher bonding force causes more stress on the die, which may damage the chip or stud bumps.

Prior art methods to address problems with underfill adhesive coverage include using multiple stud bumps that are formed on top of each other. Forming two or more stud bumps on top of each other, results in a taller bump that increases the gap between the chip and the substrate, thereby increasing the space in which the underfill flows. A disadvantage of using stacked stud bumps is the increase in manufacturing time that is needed to form the additional bumps. A further disadvantage of this method is that the stacked stud bumps tend to be weaker than single bumps and the die undergoes additional stress to form the extra bumps.

Another prior art method of increasing the space between the chip and substrate is to remove the PBO layer from the chip. A disadvantage of this method is poor die reliability because protection of the die surface has been removed. Accordingly, the removal of the protective overcoat layer is not desired.

SUMMARY OF THE INVENTION

These and other problems are generally solved or circumvented, and technical advantages are generally achieved, by preferred embodiments of the present invention in which larger stud bumps are produced using a capillary that has an internal sidewall area that raises the chamfer away from the face of the tool, thereby creating more volume for the stud bump to be formed.

In accordance with a preferred embodiment of the present invention, a capillary for use in creating stud bumps in a flip chip assembly, comprises a hole section adapted to pass a wire; a chamfer section providing a transition from the hole section to a stud bump section; and a sidewall within the stud bump section, the sidewall having a sidewall height. The sidewall height is selected to create a stud bump wherein the side wall height is equal to, or greater than, the stud bump section diameter.

An advantage of the present invention is the ability to manufacture stud bumps with increased stand-off heights in a single process rather than having to stack individual stud bumps on top of each other.

A further advantage of the present invention is an increase in the space between the chip and the substrate, which allows the underfill adhesive to flow more freely and to fill all the voids between the chip and the substrate. The present invention does not require the removal of the PBO or PIQ protective overcoat to create additional space between the chip and the substrate.

An additional advantage of the invention is that stronger, more reliable joints are produced using the larger stud bumps without the need for using excess amounts of solder to form the joints. The present invention can be used in both gold and copper stud bumping processes.

A further advantage of the present invention is the use of a tapered section at the tip of the capillary to ensure that adjacent stud bumps are not damaged during the formation of new stud bumps. The size of the tapered section may be selected to facilitate the production of stud bumps in ultra fine pitch bonding.

DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Currently preferred embodiments for making and using the present invention are discussed in detail below. It should be appreciated, however, that the present invention provides many applicable inventive concepts that can be embodied in a wide variety of specific contexts. The specific embodiments discussed herein are merely illustrative of specific ways to make and use the invention, and they are not intended to limit the scope of the invention.

The present invention will be described with respect to preferred embodiments in a specific context, namely a flip chip assembly with gold stud bumps. The invention may also be applied, however, to other flip chip assemblies using other materials, such as copper, to form the stud bumps.

Figure 1:
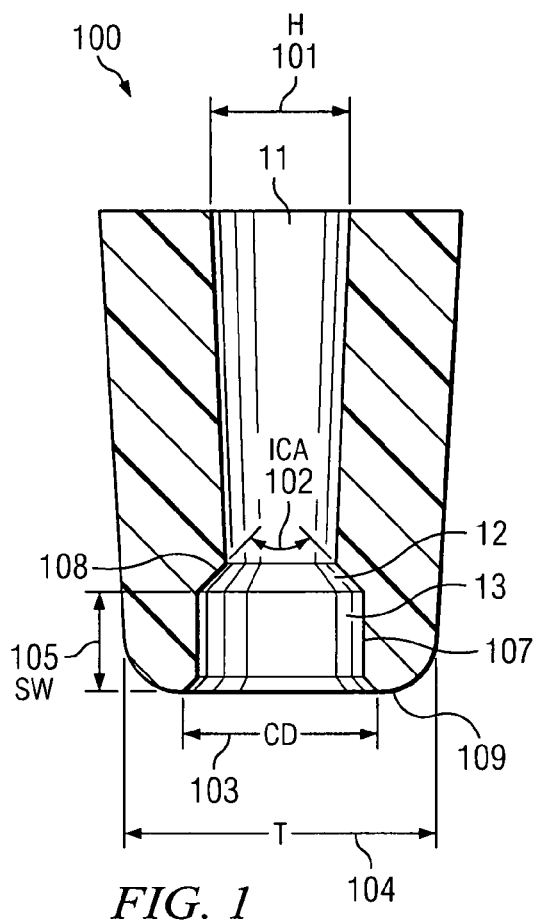
FIG. 1 is an exemplary embodiment of a capillary incorporating aspects of the present invention.

FIG. 1 is an exemplary embodiment of a novel capillary 100 that is designed to produce stud bumps with increased stand-off height. The dimensions of capillary 100 are hole diameter (H) 101, inside chamfer angle (ICA) 102, chamfer diameter (CD) 103, tip diameter (T) 104, and sidewall height (SW) 105. Sidewall 107 is present in capillary 100, but not in prior art capillaries. Sidewall 107 raises chamfer 108 above face 109 of capillary 100 by height SW 105.

Capillary 100 consists of three major sections: hole section 11, chamfer section 12, and stud bump section 13. Hole section 11 is adapted to allow wire, such as gold or copper wire, to pass for use in the manufacturing of stud bumps. Chamfer section 12 provides a transition from hole section 11 to stud bump section 13. Stud bump section 13 provides an area in which wire fed through hole section 11 is melted and formed into stud bumps. The size and shape of stud bump section 13 may be varied to modify the form of the resulting stud bumps. Although stud bump section 13 will typically have a circular cross-section, other cross-sectional shapes may also be used. Chamfer section 12 will typically be a 45-55 degree transition from hole section 11 to stud bump section 13, but other transitions, including steeper, shallower, or rounded transitions, may also be used. Tip diameter (T) 104 does not affect the size or shape of the resulting stud bumps, but does affect the bump pitch that can be produced.

Figure 2A:
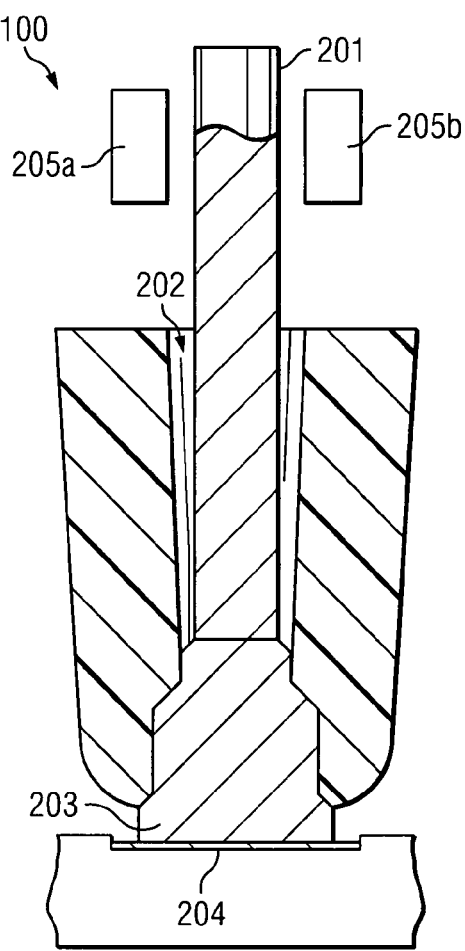
FIGS. 2A-2D illustrate a process for manufacturing stud bumps in a flip chip device using embodiments of the present invention.
Figure 2B:
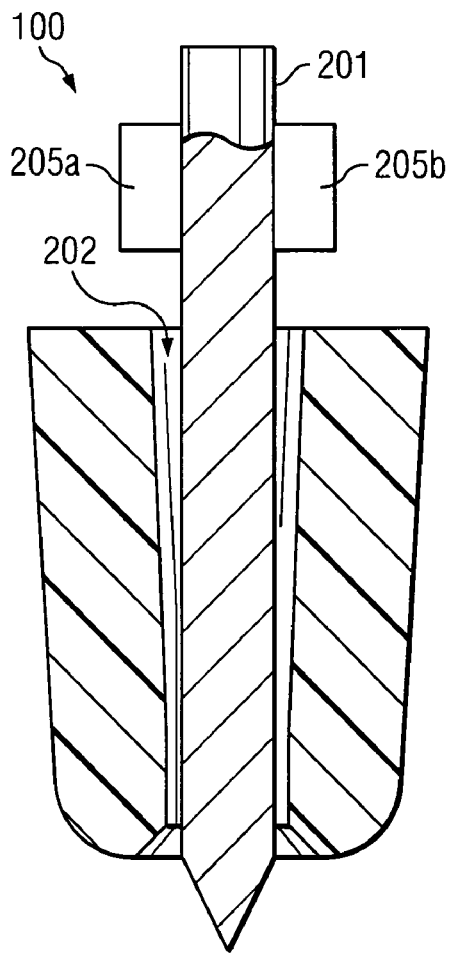

FIG. 2A illustrates an exemplary embodiment of the present invention in which stud bumps are created using capillary 100 (FIG. 1). Gold wire 201 passes through hole 202 of capillary 100. Gold wire 201 is melted to form a ball or sphere 203 on chip bond pad 204. After gold ball 203 is attached to chip bond pad 204, then gold wire 201 is broken off as shown in FIG. 2B. Wire 201 may be separated, for example, using jaws 205a/b of a wire clamp to grab gold wire 201 and then move wire 201 and capillary 100 away from ball 203, which causes wire 201 to break. When gold wire 201 is broken, stud bump 206 remains on bond pad 204 and provides a permanent connection to the underlying metal.

Figure 2C:
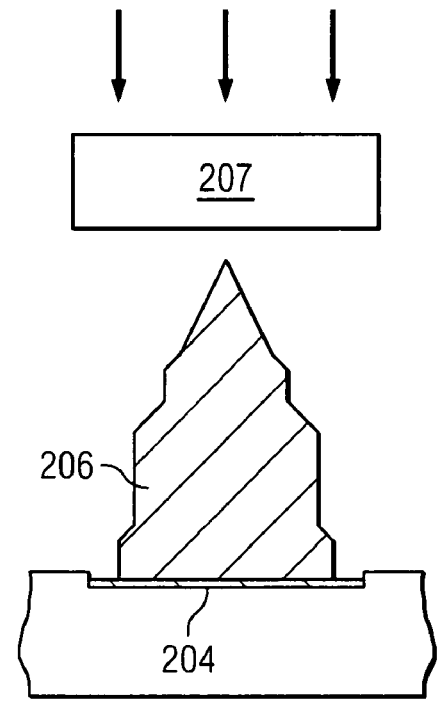
Figure 2D:
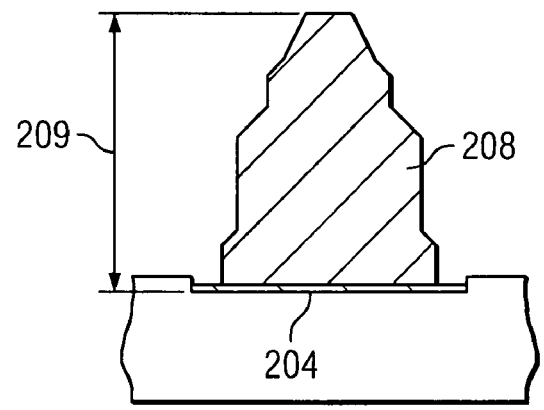

After stud bump 206 is formed, it may be coined as shown in FIG. 2C to provide a flatter top surface and more uniform bump height. Each bump 206 may be coined by tool 207 immediately after forming, or all bumps on the die may be simultaneously coined by pressure against a flat surface in a separate operation following bumping. The result is coined stud bump 208 (FIG. 2D) having stand-off height 209. Stand-off height 209 for stud bump 208 is greater than the stand-off heights of prior art stud bumps due to the addition of sidewall 107. The addition of sidewall 107 to capillary 100 (FIG. 1) creates a higher open space in the area where the stud bump is formed, which results in bigger stud bump 208. Increasing SW height 105 directly causes an increase in the size of stud bump 208. Stand-off height 209 on stud bump 208 is controlled by the size of SW height 105. In a preferred embodiment, side wall height 105 is equal to, or greater than, stud bump chamfer diameter. Although wire 201 is referred to as gold wire in this exemplary embodiment, it will be understood that the novel capillary described herein can be used with gold or copper wire, or with any other wire material now known or later developed.

Figure 3:
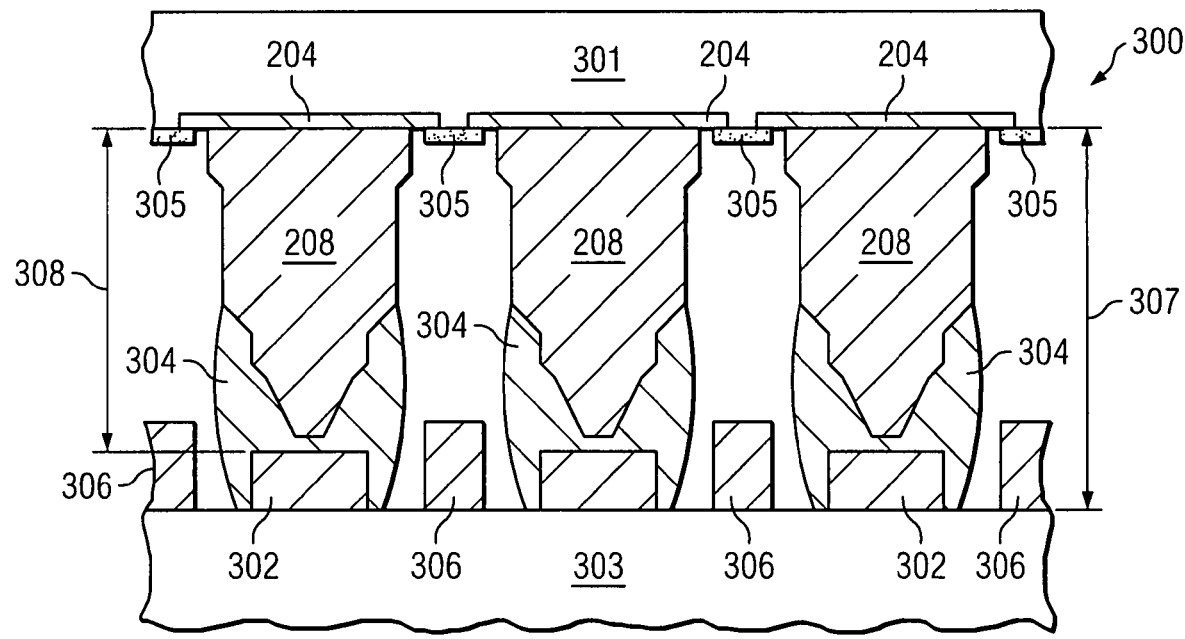
FIG. 3 is a flip chip device incorporating embodiments of the present invention.

FIG. 3 illustrates flip chip assembly 300 in which stud bumps 208 have been formed on bond pads 204 of chip 301 using capillary 100. Chip 301 is then flipped so that stud bumps 208 face downward and are aligned with bond pads 302 on substrate 303. Once aligned, each stud bump 208 is electrically and mechanically connected to corresponding bond pad 204 using solder 304. The surface of chip 301 may be covered with a protective polymer overcoat such as polyimide (PIQ) or poly-benzoxasole (PBO) 305. The surface of substrate 303 may be covered with solder resist 306.

In the final stage of assembly, the space 307 between chip 301 and substrate 303 is filled with a non-conductive underfill adhesive that joins the entire surface of the chip to the substrate. Because of the increased stand-off height in stud bumps 208, space 307 is much bigger than the space between the chip and substrate found in prior art flip chip assemblies. Therefore, the underfill material flows better and is more likely to fill all the voids in space 307.

In a flip chip assembly manufactured using an exemplary embodiment of the present invention, the stand-off height 209 for stud bumps 208 may be 75 um or greater. The resulting gap 808 between bond pads 204 on chip 301 and bond pads 302 on substrate 303 may be 75 um or greater, and the gap between protective overcoat 305 and solder resist 306 may be 55 um or greater. This provides a much larger area for the underfill adhesive must flow between chip 301 and substrate 303. Although an example stud bump height of 75 um is used herein, it will be understood that both taller and shorter stand-off heights can be used as a result of the present invention, as long as the side wall height is equal to, or greater than, the a diameter of the stud bump section of the capillary.

Figure 4:
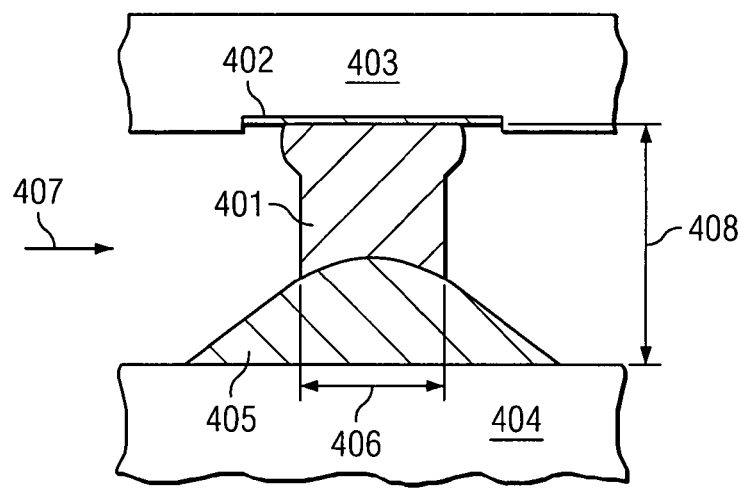
FIG. 4 is a stud bump solder joint incorporating aspects of the present invention.

FIG. 4 illustrates stud bump 401 formed on bond pad 402 of chip 403, which has been flipped and connected to substrate 404 via solder 405. The size of the effective joint (406) formed between chip 403 and substrate 404 is larger than the effective joint formed using prior art stud bumps. Using stud bump 401, underfill 407 has a larger space 408 between chip 403 and substrate 404 in which to flow. As a result, underfill 407 is more likely to flow around joint stud bump 401 to fill in all of the voids in space 408.

Figure 5:
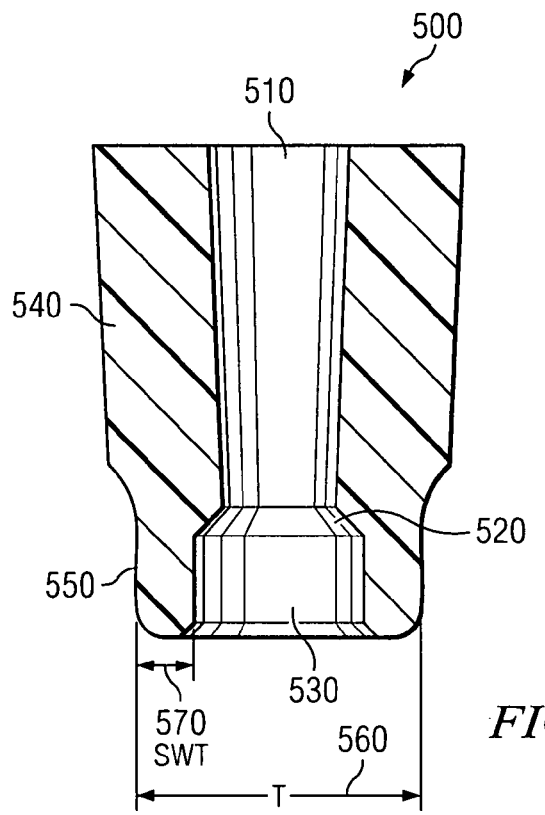
FIG. 5 is an alternative embodiment of a capillary incorporating aspects of the present invention.

FIG. 5 is an alternative embodiment of a capillary incorporating aspects of the present invention. Capillary 500 is designed specifically for use in ultra fine pitch bonding. Capillary 500 incorporates the three major internal sections that were discussed above with respect to capillary 100 (FIG. 1), including hole section 510, chamfer section 520, and stud bump section 530. The parameters of sections 510-530 are the same as those discussed with respect to exemplary capillary 100; however, capillary 500 differs in the construction of its outside walls 540, which include a tapered portion 550. As result of tapered section 550, the tip diameter (T) 560 of capillary 500 is narrower than tip diameter T 104 on the embodiment illustrated as capillary 100.

Figure 6:
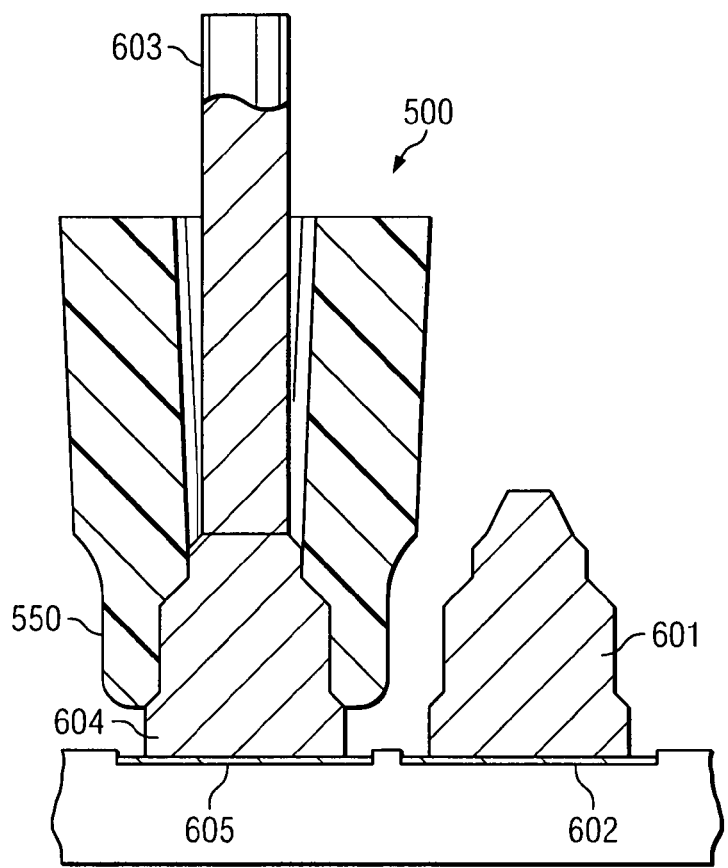
FIG. 6 illustrates the formation of stud bumps in ultra fine pitch bonding using the capillary embodiment shown in FIG. 5.

Tapered section 550 allows capillary 500 to form stud bumps on bond pads that are very close to each other, such as in ultra fine pitch bonding. Tapered section 550 prevents capillary 500 from hitting adjacent stud bumps when forming a new stud bump. FIG. 6 illustrates the formation of stud bumps in ultra fine pitch bonding using capillary 500. Stud bump 601 has been formed on bond pad 602 by capillary 500, which then moves to form stud bump 604 on bond pad 605 using gold or copper wire 603. Tapered section 550 is adapted to fit close to previously formed stud bump 601 without damaging it. The size of side wall thickness (SWT) 570 (FIG. 5) is selected to create the form of tapered section 550 that will properly fit next to existing stud bump 601.

The tip diameter, hole diameter, and chamfer diameter are not unique to the novel capillary design described herein, and can be selected using criteria known in the art. In current practice, the dimensions of these parameters depend on the process needs, such as bond pad opening, bond pad pitch, and wire diameter. In prior art capillaries that are used for stitch bonding, the tip diameter and chamfer diameter are balanced because they affect the second bond (or stitch bond). A bigger chamfer diameter will give a good ball bond, but also gives a smaller stitch size given the same tip diameter. The difference between the chamfer diameter and tip diameter in prior art capillaries will determine the size of the stitch bond. Other dimensions of prior art capillaries are also not critical to the present invention. For example, the face angle and outer radius affect stitch bonding, but have little impact on the present invention.

For the novel capillary design described herein, the stitch size is irrelevant because the capillary is used for stud bumping. In the stud bump capillary, the chamfer diameter may be as big as possible without considering the stitch bond. The side wall thickness parameter must be selected to ensure that the tapered portion or tip of the capillary is of sufficient strength. If the chamfer diameter is too large with respect to the tip diameter, then the tip will be weak and prone to damage during use.

The side wall height parameter is unique to the capillary design disclosed herein. The side wall height is dictated by the chamfer diameter. The side wall height should be equal to, or greater than, the chamfer diameter to produce sufficient stand-off height and good bonding. If the side wall height is too big compared to chamfer diameter, the capillary will form skinny stud bonds that will have poor bonding.

In a typical embodiment, the tip diameter ranges from 50 to 100 um, hole diameter from 20 to 35 um (1.3-1.5X wire diameter), and chamfer diameter from 25 to 60 um. Actual values are selected depending upon wire diameter, bond pad pitch, and bond pad opening. A pitch of 50 um and below is considered to be ultra fine pitch bonding. For a pitch of 50 um, the tip diameter would be approximately 60 um.

Although the present invention and its advantages have been described in detail, it should be understood that various changes, substitutions and alterations can be made herein without departing from the spirit and scope of the invention as defined by the appended claims. For example, the outside shape of the capillary tool may take many forms without changing the internal dimensions of the chamfer area where the stud bump is formed. As another example, it will be readily understood by those skilled in the art that the chamfer diameter and sidewall height of the capillary may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing stud bumps, the method comprising:

forming a first stud bump using a capillary having a hole section adapted to pass a wire, a chamfer section providing a transition from the hole section to a first end of a stud bump section having a stud diameter smaller than the hole section, a second chamfer section providing a transition form a second end of the stud bump section to a section with an inside diameter smaller than the stud diameter, a sidewall within the stud bump section, between the two chamfer sections the sidewall having a sidewall height equal to, or greater than, the stud diameter.

2. The method of claim 1, wherein the capillary further includes a tapered section, the method further comprising:

forming a second stud bump using the capillary, the second stud bump adjacent to the first stud bump, and the tapered section adapted to allow the first and second stud bumps to be formed with a pitch of 50 um or less.

3. The method of claim 2, wherein the tapered section is adapted to allow a tip of the capillary to fit over the first stud bump during the forming of the second stud bump.

4. The method of claim 3, wherein the sidewall height is selected to form a stud bump having a stand-off height of at least 75 um.

5. The method of claim 2 wherein the wire is copper or gold.

* * * * *